Figure 1:
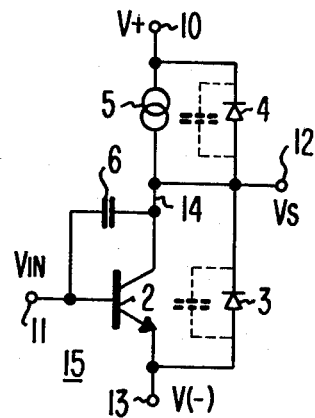

United States Patent [19]

Robe

[11] 4,240,042
[45] Dec. 16, 1980

[54] BANDWIDTH LIMITED LARGE SIGNAL IC AMPLIFIER STAGE

[75] Inventor: Thomas J. Robe, Bridgewater, N.J.

[73] Assignee: RCA Corporation, New York, N.Y.

[21] Appl. No.: 27,237

[22] Filed: Apr. 5, 1979

[51] Int. Cl.³ ............................ H03F 1/26; H03F 3/19
[52] U.S. Cl. .................................... 330/302; 330/149; 330/307
[58] Field of Search ............... 330/149, 292, 296, 302, 330/307

[56] References Cited

U.S. PATENT DOCUMENTS

| | | | |
|---|---|---|---|
| 3,712,995 | 1/1973 | Steudel | 307/304 |
| 3,947,727 | 3/1976 | Stewart | 330/207 P X |

Primary Examiner—James B. Mullins
Attorney, Agent, or Firm—Paul J. Rasmussen; Peter M. Emanuel; Eric P. Herrmann

[57] ABSTRACT

An amplifier stage is disclosed having junction capacitors for by-passing high frequency signals without introducing substantial signal nonlinearities. A pair of similar serially connected diodes are reverse biased between the amplifier supply potentials. The mid-point connection of the diodes is connected to the amplifier node to be by-passed paralleling the junction capacitances of the diodes with respect to a-c potential excursions. Typical diode capacitance variations resulting from changes in the reverse bias potential across a pn junction is minimized by this arrangement.

6 Claims, 3 Drawing Figures

BANDWIDTH LIMITED LARGE SIGNAL IC AMPLIFIER STAGE

This invention relates to amplifier stages and in particular to integrated circuit (IC) amplifier stages requiring bandwidth control or oscillation suppression.

High-gain and high-frequency amplifiers incorporating feedback frequently exhibit operating instabilities under certain bias or operating conditions owing to inadequate phase margin in the feedback loop at higher frequencies. Typically the instabilities are manifested by the amplifier operating in an oscillatory mode overriding the desired circuit response. To eliminate the oscillatory modes, capacitors are incorporated into the amplifier to shunt all frequency components higher than the desired cut off frequency, including those frequencies at which the amplifier would naturally tend to oscillate.

In the fabrication of IC amplifiers there are two types of capacitors available for incorporation within the monolithic structure. One type depends upon the capacitance exhibited by the space-charge or depletion-region of a pn junction. The other type depends upon the MOS capacitance exhibited by the parallel plate sandwich structure comprising a metal plate separated from the silicon portion of the monolithic-die by a thin layer of insulating material. MOS capacitors exhibit constant capacitance values with respect to applied potentials and exhibit substantially infinite series resistance, but they are extremely susceptible to catastrophic or permanent damage from voltage transients caused by electrostatic discharge. PN junction capacitors, on the other hand, are very non-linear with respect to reverse bias potential applied between anode and cathode but are superior to MOS capacitors in their resistance to electrostatic discharge damage. The nonlinearity of the PN capacitance arranged within a signal carrying circuit undesirably causes both signal nonlinearities and the introduction of signal harmonics, however.

Capacitors arranged to shunt or compensate high frequency oscillations are typically connected between a signal node of the amplifier and a supply bus. Voltage transients occurring on the supply bus either as a result of electrostatic charging or handling or because of some system malfunction may be impressed across the capacitor. Such transients impressed across an MOS capacitor, if above a prescribed voltage level established by the MOS dielectric or insulator field strength, can rupture the dielectric, precipitating a total failure mode for the amplifier.

The present invention demonstrates a means of effectively reducing the nonlinearities of a junction-capacitor to an acceptable level to take advantage of its greater immunity to damage from voltage transients.

The frequency response or bandwidth of an amplifier stage is limited by shunting high frequency components to the supply busses via first and second similar pn junctions or junction diodes. The diodes are serially connected in reverse bias condition between the amplifier supply terminals. The amplifier stage output terminal or the node from which high frequency components are to be shunted is connected to the interconnection of the serially connected diodes, which are effectively paralleled to shunt the undesired signal components to the supply potentials.

Junction-capacitance nonlinearities are minimized in this circuit by virtue of the fact that a voltage excursion at the interconnection of the two diodes simultaneously increases the reverse bias potential across the first diode and decreases the reverse bias potential across the second diode. The increase in reverse bias potential across the first diode is accompanied by a decrease in its junction capacitance. The decrease in reverse bias potential across the second diode is accompanied by an increase in its junction capacitance. The total capacitance being the sum of the two junction diode capacitances therefore remains relatively constant.

Figure 2:
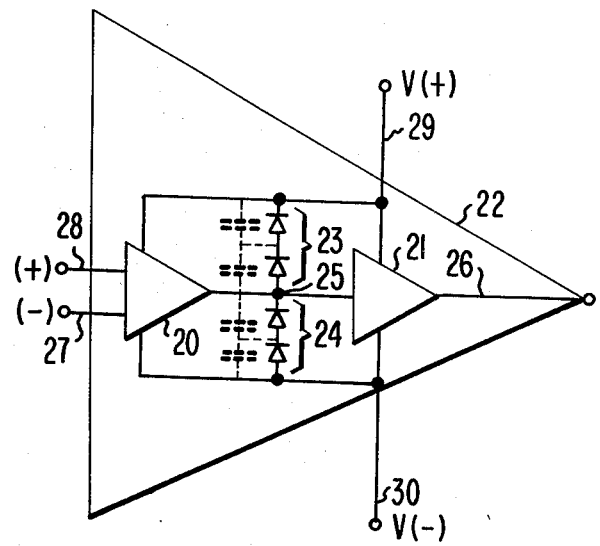
Figure 3:
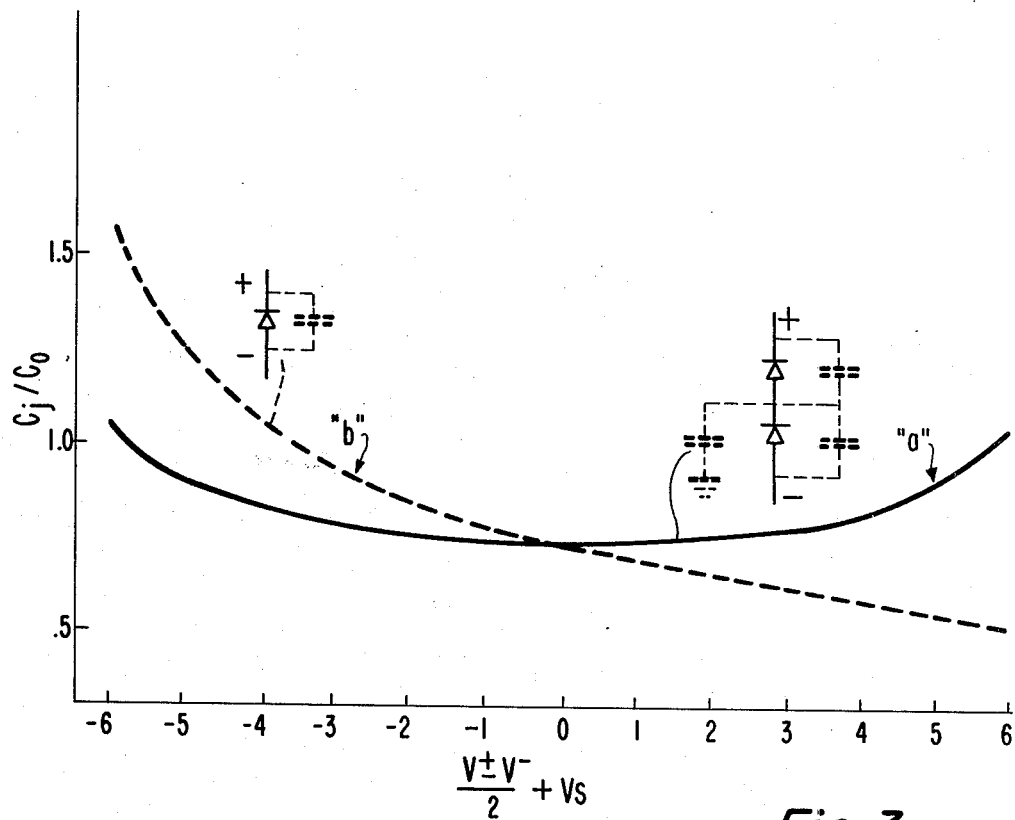

The invention will be particularly described with reference to the drawings where:

FIGS. 1 and 2 are respective schematic and block diagrams of representative embodiments of the invention; and FIG. 3 plots against the same coordinates the capacitance versus voltage characteristics of two junction capacitors in inverse-parallel connection for signal, per the present invention, and a single junction capacitor.

The FIG. 1 circuit is an integrated-circuit amplifier stage 15 assumed to have high voltage gain and an inherent high frequency response. Transistor 2 is arranged as a common-emitter amplifier with current source 5 as a load. Relatively positive $V^+$ and relatively negative $V^-$ supply potentials are provided at terminals 10 and 13 respectively. Input signal $V_{in}$ is applied at terminal 11 and output signal $V_S$ is available at terminal 12.

Compensation capacitor 6 is connected between the input and output terminals of the common-emitter amplifier to establish the frequency response of the amplifier, especially necessary where stage 15 is cascaded with preamplifier and postamplifier stages. The inclusion of capacitor 6 may, however, provide an undesirable feedback path with sufficient phase shift at higher frequencies to cause the stage 15 to be oscillatory. The oscillations may be reduced or eliminated by including a degeneration resistor in the emitter circuit of transistor 2 or by increasing the size of capacitor 6. Both of these solutions are undesirable however, as the former reduces gain and the latter reduces overall bandwidth.

A third alternative means to eliminate oscillatory modes is to use a high frequency bypass capacitor between output terminal 12 and a point of constant potential, which capacitor might typically be in the order of 5-10 picofarads. As previously noted, MOS capacitors are undesirable for this application due to their electrostatic vulnerability.

However, junction capacitors exhibit marked capacitance changes with varying voltage. Further, the minimum junction size would need be determined for maximum applied voltages. But this imposes larger than necessary capacitance at lower applied voltages, limiting the overall frequency response of the amplifier.

A combination of two semiconductor junction diodes, 3 and 4, are arranged serially between terminals 10 and 13 in the FIG. 1 circuit. Output terminal 12 is at their interconnection and the diodes are in inverse-parallel to provide the bypass capacitance insofar as a-c signal variations at output terminal 12 is concerned. Junction diodes exhibit a pn junction capacitance by virtue of their space charge or depletion region tending to isolate their anode regions from their cathode regions. This capacitance is represented by the expression.

$$C_j = \frac{C_o}{\sqrt{\phi_D + V_r}}$$

where $\phi_D$ is the built-in junction potential of the diode junction, $V_r$ is the reverse bias potential across the diode junction, and $C_o$ is the capacitance per unit area of the junction for $\phi + V_r$ equal to 1 volt.

Equation 1 indicates that: as the reverse bias $V_r$ increases in absolute value, the junction capacitance $C_j$ decreases.

Diodes 3 and 4 are both connected in a reverse-biased or high-impedance direction with respect to output terminal 12. With respect to the load impedance of the amplifier, the real part of the diode impedance is substantially infinite. The capacitance exhibited by the junctions of the diodes are effectively paralleled with respect to a-c signals. The a-c bypass capacitance connected at terminal 12 is thus the sum of the capacitance of diodes 3 and 4.

Diodes 3 and 4 have a total reverse potential of $V^+ - V^-$ imposed across their serial connection. A quiescent output potential at output terminal 12, equal to $(V^+ + V^-)/2$, conditions the reverse bias potential $V_{r3}$ across diode 3 to equal the reverse bias potential $V_{r4}$ across diode 4. Signal excursions from their quiescent potential value creates complementary potential changes across the diodes, i.e., as $V_{r3}$ ($V_{r4}$) increases $V_{r4}$ ($V_{r3}$) decreases by equal amounts. Consequently the junction capacitance $C_{j3}$ ($C_{j4}$) decreases and $C_{j4}$ ($C_{j3}$) increases. Since the effective capacitance from terminal 12 to signal ground potential is the sum of junction capacitance $C_{j3}$ of diode 3 and the junction-capacitance of $C_{j4}$ of diode 4, the increase in $C_{j3}$ ($C_{j4}$) is partially compensated by the decrease in $C_{j4}$ ($C_{j3}$). The curve "a" shown in FIG. 3 shows the relative variation in capacitance afforded by the serially connected diodes 3 and 4 between supply potential $V^+$ and $V^-$ in the FIG. 1 circuit for output signal excursions of ($\pm$) six volts from the quiescent output potential. It is seen that the capacitance is relatively constant over a range of signal excursion. In contrast to this the variation in capacitance of a single junction diode is depicted in FIG. 3 as the curve "b", which diode has the same capacitance value at the quiescent output potential as the inversely paralleled capacitances $C_{j3}$ and $C_{j4}$.

The FIG. 2 circuit includes integrated circuit amplifier 22 having an output amplifier 21 in cascade after preamplifier stage 20. Both amplifier stages 20 and 21 receive supply potentials $V^+$ and $V^-$ from respective terminals 29 and 30. Preamplifier 20 receives inverting and non-inverting input signals via respective terminals 27 and 28. The output connection of 20 at 25 is provided with high-frequency bypass capacitors in the form of serially connected junction diode strings 23 and 24 connected between output connection 25 and the supply terminals. The performance of the diode strings 23 and 24 is similar to the performance of diodes 4 and 3 of the FIG. 1 circuit, except that the potential change across any one diode junction is reduced, thereby reducing the capacitance change and further reducing total capacitance variations.

IC amplifiers generally do not contain sufficient internal inductances to cause the output potential of an internal amplifier stage to swing beyond the limits of the supply potentials. Therefore diodes 23 and 24 never become forward biased to short-circuit the output connection.

The embodiments included in the drawings are representative of the invention. However, one skilled in the art of transistor amplifier design and armed with the foregoing disclosure will be able to readily generate additional embodiments without straying from the spirit of the invention and the claims should be construed in this light. For example, each of the diodes may be replaced by a number of series-connected diodes to reduce the voltage change across any diode and thereby reduce the total capacitance variations. In addition where the quiescent potential is not divided evenly between the diodes connected to the positive and negative supply potentials, e.g., diodes 3 and 4 of FIG. 1, they may be substituted for by serial strings of different numbers of diodes arranged to provide the least capacitance change for the expected potential variations.

It is emphasized that the bypass capacitance is not constrained to application at the amplifier output terminal but may as in the case of FIG. 2 post amplifier 21 be utilized at an amplifier input terminal where the quiescent potential may be of a more convenient value or at some other convenient circuit node.

What I claim is:

1. An amplifier stage comprising:
    first and second terminals for applying relatively positive and relatively negative supply potentials thereto;
    third and fourth terminals for supplying input and output signals respectively;
    a transistor having input, common and output electrodes respectively connected to the third, second and fourth terminals;
    load means connected between the first and fourth terminals;
    means for by-passing said fourth terminal to said first terminal for relatively high frequencies including
    first pn junction diode means connected in reverse-biased poling between the first and fourth terminals;
    means for by-passing said fourth terminal to said second terminal for relatively high frequencies including
    second pn junction diode means connected in reverse-biased poling between the second and fourth terminals whereby the first and second pn junction diode means are constrained from conducting in the forward direction and the sum of the capacitance associated with their pn junctions remains relatively constant for applied signal variations.

2. An amplifier as set forth in claim 1 wherein the first and second pn junction diode means have similar pn junction diffusion profiles and similar pn junction areas, including means for maintaining similarly valued quiescent potentials across each of said first and second pn junction diode means.

3. In combination:
    a voltage amplifier stage having signal input and signal output terminals;
    means for supplying relatively positive and relatively negative supply potentials to condition said amplifier to operate, said amplifier exhibiting an output signal potential not exceeding the supply potentials;
    first and second diode means having similar pn junction characteristics and junction areas, said first diode means connected between said positive supply potential and the output terminal, said second diode means connected between the negative supply potential and the output terminal, both first and second diode means poled to be non-conducting for the entire range of output signal potentials, the junctions of said diodes providing sufficient capacitance to shunt high frequency signal components above a prescribed frequency.

4. A combination as set forth in claim 3 wherein said first and said second diode means each consists of a respective single pn junction.

5. A combination as set forth in claim 3 wherein the first and second diode means comprise first and second serially-connected strings of like numbered junction diodes.

6. A combination as set forth in claim 3 wherein the first and second diode means comprise first and second serially-connected strings of junction diodes of differing numbers of diodes.

* * * * *